US007642805B1

United States Patent
Yinn et al.

(10) Patent No.: US 7,642,805 B1
(45) Date of Patent: Jan. 5, 2010

(54) SHORT DETECTION CIRCUIT

(75) Inventors: Aung Aung Yinn, Sinshih Township, Tainan County (TW); Tyng-Yang Chen, Sinshih Township, Tainan County (TW); Chow-Peng Lee, Sinshih Township (TW)

(73) Assignee: Himax Analogic, Inc., Sinshih Township, Tainan County (TW)

( * ) Notice: Subject to any disclaimer, the term of this patent is extended or adjusted under 35 U.S.C. 154(b) by 0 days.

(21) Appl. No.: 12/236,070

(22) Filed: Sep. 23, 2008

(51) Int. Cl.
*G01R 31/00* (2006.01)
*G01R 31/02* (2006.01)
(52) U.S. Cl. ............ 324/770; 324/158.1; 361/18; 345/904
(58) Field of Classification Search ............ 324/770; 361/18; 345/904
See application file for complete search history.

(56) References Cited

U.S. PATENT DOCUMENTS 7,218,062 B1 * 5/2007 Wang et al. ............... 315/225

2009/0002901 A1 * 1/2009 Matsumoto et al. ......... 361/18

* cited by examiner

*Primary Examiner*—Ha Tran T Nguyen
*Assistant Examiner*—Emily Y Chan
(74) *Attorney, Agent, or Firm*—Thomas, Kayden, Horstemeyer & Risley

(57) ABSTRACT

A short detection circuit to detect a short condition in a backlight module, wherein the backlight module comprises a WLED circuit having a first terminal connected to an output voltage and second terminal connected to a driver IC. The short detection circuit comprises: a PMOS, a NMOS, a load and a detection module. The gate of the PMOS receives a first voltage and the source of the PMOS connects to the second terminal; the gate of the NMOS receives a reference voltage, the drain of the NMOS connects to the drain of the PMOS and the source of the NMOS connects to a detection terminal. The voltage of the detection terminal becomes a high state when the WLEDs have a short condition; and the detection module is connected to the detection terminal, when the voltage of the detection terminal becomes a high state, the detection module detects a short condition.

14 Claims, 4 Drawing Sheets

SHORT DETECTION CIRCUIT

BACKGROUND

1. Field of Invention

The present invention relates to a short detection circuit. More particularly, the present invention relates to a short detection circuit adapted in a backlight module.

2. Description of Related Art

Recently, white-light emitting diodes (WLEDs) are widely used as the backlight source in the LCD panel. In order to drive more WLEDs in the panel, the driver IC provides high voltage to supply the WLEDs. When some of the WLEDs are broken, a short condition will happen to generate an extreme high voltage in the short WLED circuit and further damage the driver IC if there is no detection and protection mechanism.

Besides, the value of the high voltage generated by the short condition depends on the number of the broken WLEDs. If the value is not high, i.e. there are not many broken WLEDs, the driver IC may not be damaged. Thus, in order to give an appropriate threshold value of the voltage of the short condition, a design of the short detection circuit that can adjust the threshold value to signal the different short condition is important.

Accordingly, what is needed is a short detection circuit to detect the short condition with an adjustable threshold value to overcome the above issues. The present invention addresses such a need.

SUMMARY

A short detection circuit is provided. The short detection circuit is to detect a short condition in a backlight module, wherein the backlight module comprises a WLED circuit having a first terminal connected to an output voltage and second terminal connected to a driver IC, the short detection circuit comprises: a PMOS, a NMOS, a load and a detection module. The PMOS comprises a gate, a drain and a source, wherein the gate of the PMOS receives a first voltage, the source of the PMOS connects to the second terminal; the NMOS comprises a gate, a drain and a source, wherein the gate of the NMOS receives a reference voltage, the drain of the NMOS connects to the drain of the PMOS and the source of the NMOS connects to a detection terminal such that when the plurality of WLED has a short condition to make a short voltage level at the second terminal passing through the PMOS and the reference voltage becomes a high state, the voltage of the detection terminal becomes a high state; the load is connected between the source of the NMOS and a ground potential; and the detection module is connected to the detection terminal, when the voltage of the detection terminal becomes a high state, the detection module detects a short condition.

Another object of the present invention is to provide a backlight module comprising: a WLED circuit, a driver IC and a short detection circuit. The WLED circuit has a first terminal connected to an output voltage; the driver IC is connected to a second terminal of the WLED circuit; and the short detection circuit comprises: a PMOS, a NMOS, a load and a detection module. The PMOS comprises a gate, a drain and a source, wherein the gate of the PMOS receives a first voltage, the source of the PMOS connects to the second terminal; the NMOS comprises a gate, a drain and a source, wherein the gate of the NMOS receives a reference voltage, the drain of the NMOS connects to the drain of the PMOS and the source of the NMOS connects to a detection terminal such that when the plurality of WLED has a short condition to make a short voltage level at the second terminal passing through the PMOS and the reference voltage becomes a high state, the voltage of the detection terminal becomes a high state; the load is connected between the source of the NMOS and a ground potential; and the detection module is connected to the detection terminal, when the voltage of the detection terminal becomes a high state, the detection module detects a short condition.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
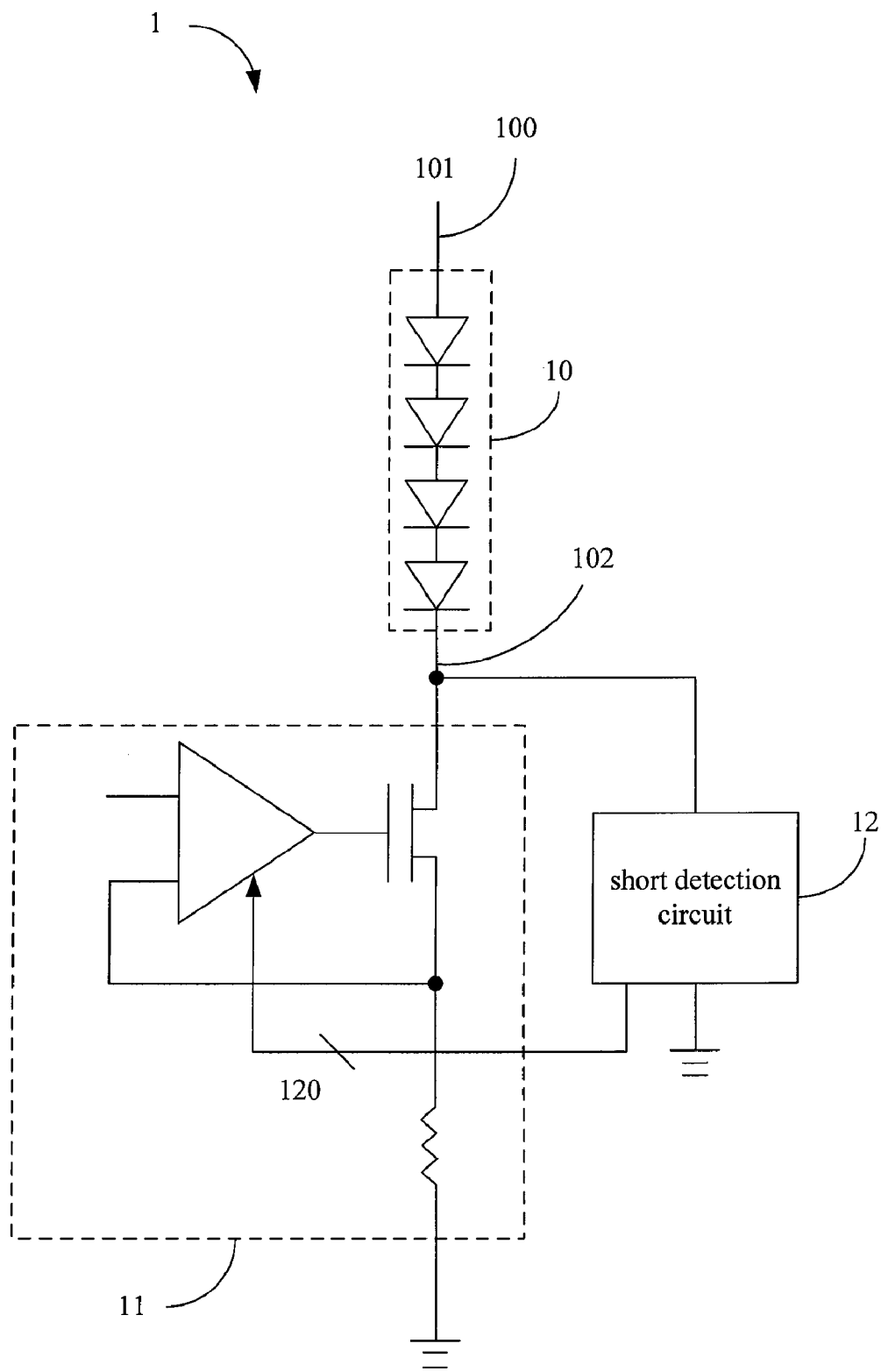
FIG. 1 is a block diagram of a backlight module of the first embodiment of the present invention.

Reference will now be made in detail to the present embodiments of the invention, examples of which are illustrated in the accompanying drawings. Wherever possible, the same reference numbers are used in the drawings and the description to refer to the same or like parts.

Please refer to FIG. 1, a block diagram of a backlight module 1 of the first embodiment of the present invention. The back light module 1 comprises a WLED circuit 10, a driver IC 11 and a short detection circuit 12. The WLED circuit 10 has a first terminal 100 connected to an output voltage 101; the driver IC 11 is connected to a second terminal 102 of the WLED circuit 10. The short detection circuit 12 connects to the second terminal 102 as well to receive the voltage of the second terminal 102. If the WLED circuit 10 has a short condition to make the voltage of the second terminal 102 become a high voltage, the short detection circuit 12 will detect the short condition and generate a disable signal 120 to cease the operation of the driver IC 11 to protect the driver IC 11 from the damage.

Figure 2:
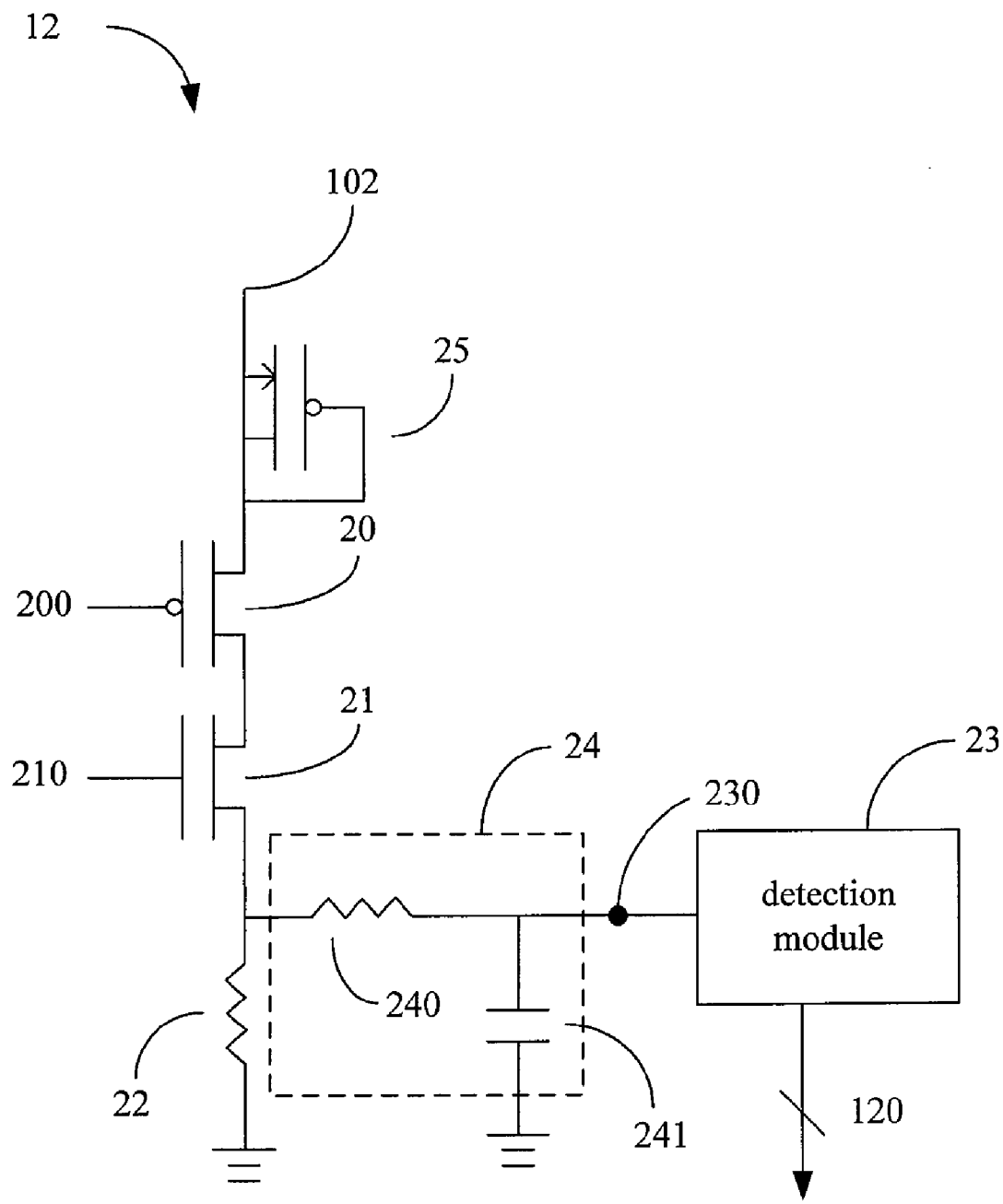
FIG. 2 is a diagram of the short detection circuit of the first embodiment of the present invention.

Please refer to FIG. 2, a diagram of the short detection circuit 12 of the first embodiment of the present invention. The short detection circuit 12 comprises: a PMOS 20, a NMOS 21, a load 22, a detection module 23, a RC circuit 24 and an enhancement PMOS 25. The PMOS 20 comprises a gate, a drain and a source, wherein the gate of the PMOS 20 receives a first voltage 201 and the source of the PMOS 20 connects to the enhancement PMOS 25, wherein the enhancement PMOS 25 further connects to the second terminal 102. The NMOS 21 comprises a gate, a drain and a source, wherein the gate of the NMOS 21 receives a reference voltage 210, the drain of the NMOS 21 connects to the drain of the PMOS 20. The load 22 is connected between the source of the NMOS 21 and a ground potential. The RC circuit 24 is connected between a detection terminal 230 and the source of the NMOS. The RC circuit 24 comprises a resistor 240 and a capacitor 241, wherein the resistor 240 connects between the detection terminal 230 and the source of the NMOS and the capacitor 241 connects between the detection terminal 230 and the ground potential. The detection module 23 is connected to the detection terminal 230. When the detection module 23 detects a short condition, the detection module 23 generates the disable signal 120 to the driver IC 11. When the driver IC 11 begins to operate, in order to prevent the detection module 23 detects the inrush current and determines it as a short condition, the RC circuit 24 acts as a filter to prevent the effect of the inrush current.

Figure 3:
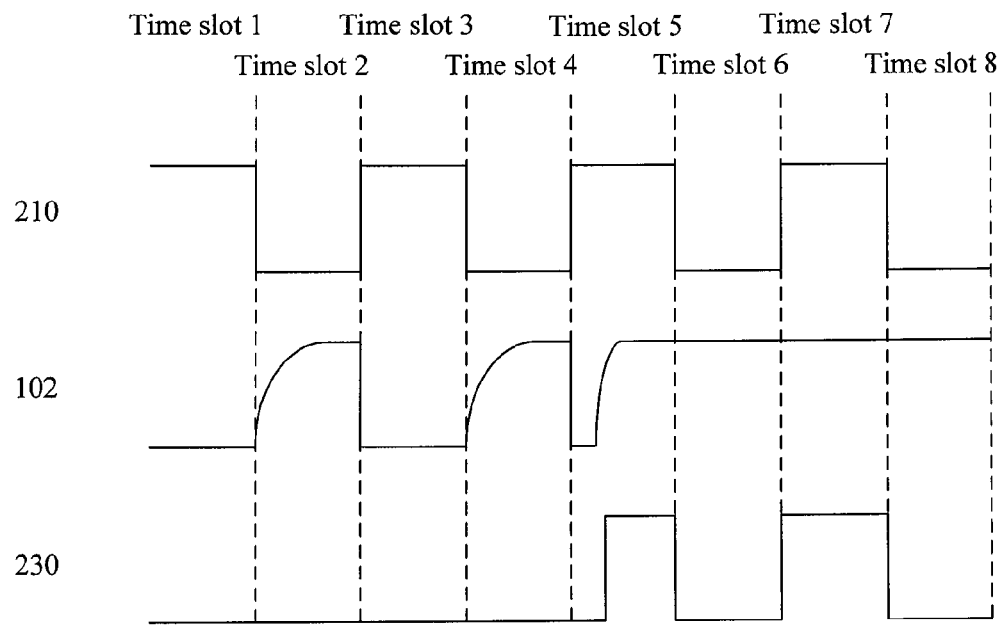
FIG. 3 is a waveform diagram of the reference voltage, the voltage of the second terminal and the detection terminal.

Please refer to FIG. 3 at the same time, a waveform diagram of the reference voltage 210, the voltage of the second terminal 102 and the detection terminal 230. The reference voltage 210 is substantially a form of square wave. When the WLED circuit 10 doesn't have the short condition, the voltage of the second terminal 102 has a charging period to charge the WLEDs in the WLED circuit 10, wherein the voltage of the second terminal is in a non-charging state when the reference voltage is in a high state and the voltage of the second terminal is in a charging state when the reference voltage is in a low state. According to FIG. 3, there is no short condition during the time slot 1-4, and the time slot 1 and 3 are in a non-charging state, wherein the time slot 2 and 4 are in a charging state. When there is no broken WLED, the voltage of the second terminal gets high (i.e. in the charging state) when the reference voltage 210 is in a low state. Thus, the NMOS 21 is not in operation during time slot 2 and 4. Although the reference voltage 210 is in high state during time slot 1 and 3, the second terminal is in non-charge state during time slot 1 and 3. There is no voltage passes through the NMOS 21 during time slot 1 and 3. The detection terminal 230 doesn't detect the short condition.

In time slot 5, a short condition occurs and keeps the second terminal 102 always a high state, i.e. a short voltage level, in the following time slot 6-8. In other embodiment, the short voltage level can be much higher than the charging voltage, depending on the number of the broken WLEDs. The short voltage level passes through the enhancement PMOS 25 and the PMOS 20 since the short voltage level is higher than the first voltage to turn the PMOS 20 on. The short voltage level further passes through the NMOS 21 in time slot 5 and 7 since the reference voltage 210 is in high state to turn the NMOS 21 on. Next, the short voltage level passes through the RC circuit 24 and makes the voltage of the detection terminal 230 a high voltage level. Thus, the detection module 23 detects the short condition and delivers the disable signal 120.

Figure 4:
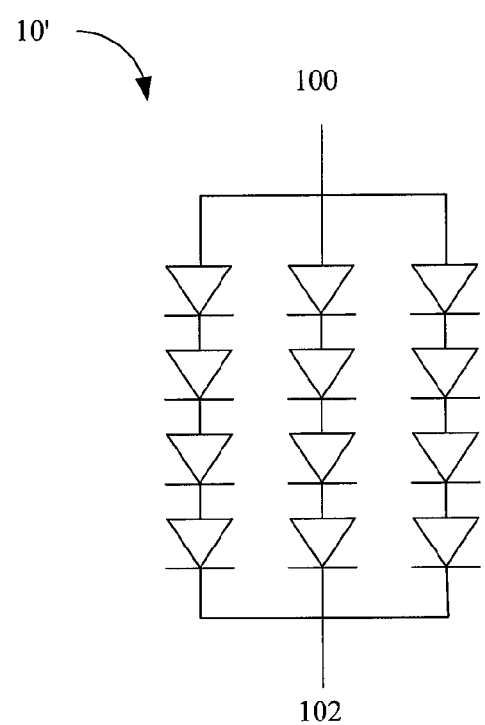
FIG. 4 is a diagram of the WLED circuit in another embodiment of the present invention.
Figure 5:
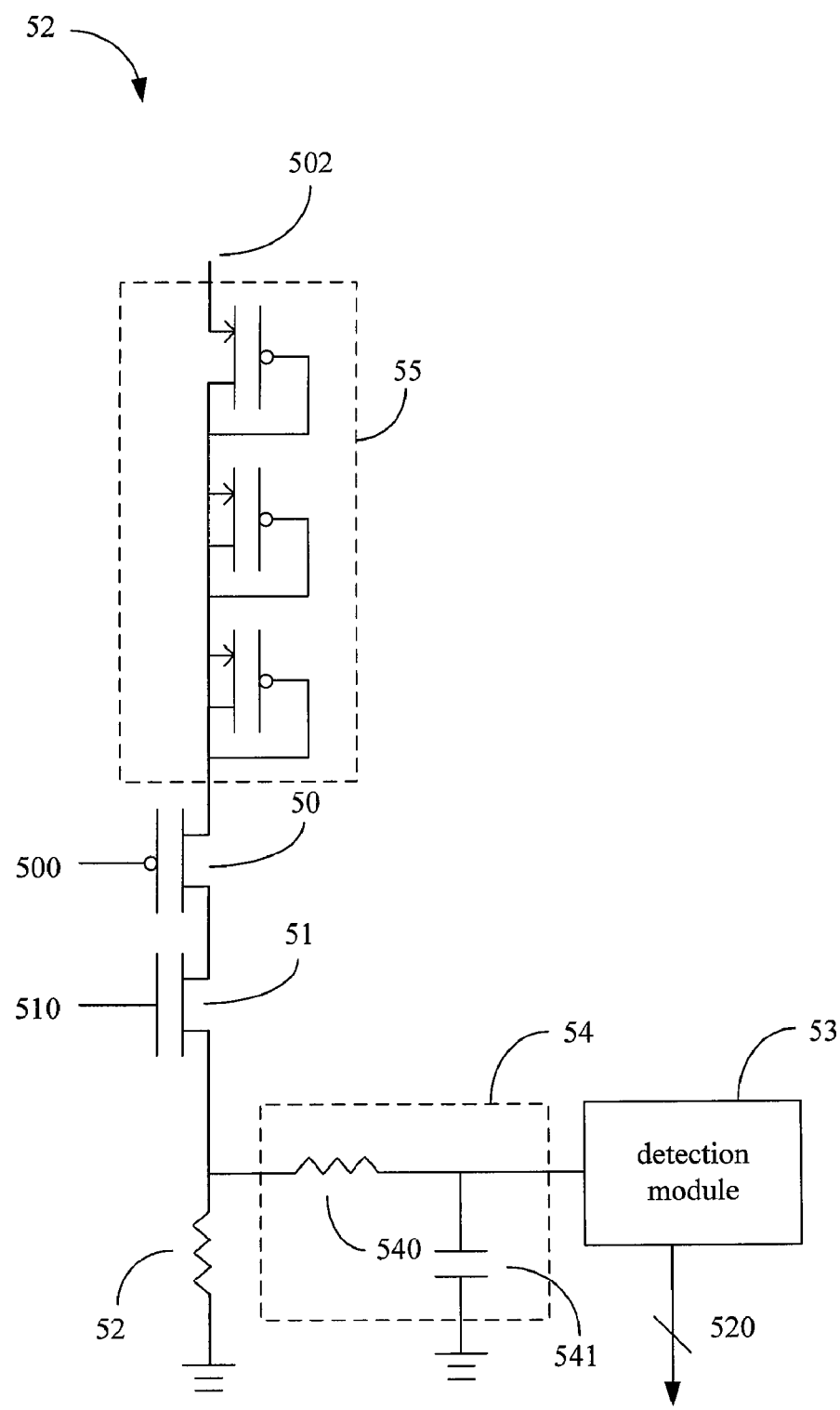
FIG. 5 is a diagram of the short detection circuit of another embodiment of the present invention.

In another embodiment, the WLED circuit 10' can comprise more WLEDs connected together as depicted in FIG. 4. In order to detect the short condition of different number of broken WLEDs in the WLED circuit, the number of the enhancement PMOS connected between the second terminal 102 and the PMOS 21 can be adjusted. As depicted in FIG. 5, the enhancement PMOS circuit 55 comprises three enhancement PMOS. Thus, it takes a higher voltage at the second terminal 502 to passes through the enhancement PMOS circuit 55. Thus, only the detection module 23 will detect a higher voltage generated by more number of broken WLEDs. Different number of the enhancement PMOS can be adjusted depending on different applications.

The short detection circuit of the present invention provides a simple design to detect the short condition of the WLED circuit to protect the driver IC. Furthermore, the enhancement PMOS circuit provides an adjustable short voltage threshold to make the short detection circuit of the present invention be suitable in different applications.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A short detection circuit to detect a short condition in a backlight module, wherein the backlight module comprises a WLED circuit having a first terminal connected to an output voltage and second terminal connected to a driver IC, the short detection circuit comprises:

a PMOS comprising a gate, a drain and a source, wherein the gate of the PMOS receives a first voltage, the source of the PMOS connects to the second terminal;

a NMOS comprising a gate, a drain and a source, wherein the gate of the NMOS receives a reference voltage, the drain of the NMOS connects to the drain of the PMOS and the source of the NMOS connects to a detection terminal such that when the plurality of WLED has a short condition to make a short voltage level at the second terminal passing through the PMOS and the reference voltage becomes a high state, the voltage of the detection terminal becomes a high state;

a load connected between the source of the NMOS and a ground potential; and a detection module connected to the detection terminal, when the voltage of the detection terminal becomes a high state, the detection module detects a short condition.

2. The short detection circuit of claim 1, further comprising at least one enhancement PMOS substantially connected between the second terminal and the source of the PMOS.

3. The short detection circuit of claim 1, further comprising a RC circuit substantially connected between the detection terminal and the source of the NMOS.

4. The short detection circuit of claim 3, wherein the RC circuit comprises a resistor and a capacitor, the resistor connects between the detection terminal and the source of the NMOS and the capacitor connects between the detection terminal and the ground potential.

5. The short detection circuit of claim 1, wherein the reference voltage is a square wave voltage.

6. The short detection circuit of claim 5, when the WLED circuit doesn't have the short condition, the voltage of the second terminal has a charging period, wherein the voltage of the second terminal is in a non-charging state when the reference voltage is in a high state and the voltage of the second terminal is in a charging state when the reference voltage is in a low state.

7. The short detection circuit of claim 1, wherein the detection module generates a disable signal to disable the driver IC when the detection module detects the short condition.

8. A backlight module comprises:

a WLED circuit having a first terminal connected to an output voltage;

a driver IC connected to a second terminal of the WLED circuit; and a short detection circuit comprises:

a PMOS comprising a gate, a drain and a source, wherein the gate of the PMOS receives a first voltage, the source of the PMOS connects to the second terminal;

a NMOS comprising a gate, a drain and a source, wherein the gate of the NMOS receives a reference voltage, the drain of the NMOS connects to the drain of the PMOS and the source of the NMOS connects to a detection terminal such that when the plurality of WLED has a short condition to make a short voltage level at the second terminal passing through the PMOS and the reference voltage becomes a high state, the voltage of the detection terminal becomes a high state;

a load connected between the source of the NMOS and a ground potential; and a detection module connected to the detection terminal, when the voltage of the detection terminal becomes a high state, the detection module detects a short condition.

9. The backlight module of claim 8, further comprising at least one enhancement PMOS substantially connected between the second terminal and the source of the PMOS.

10. The backlight module of claim 8, further comprising a RC circuit substantially connected between the detection terminal and the source of the NMOS.

11. The backlight module of claim 10, wherein the RC circuit comprises a resistor and a capacitor, the resistor connects between the detection terminal and the source of the NMOS and the capacitor connects between the detection terminal and the ground potential.

12. The backlight module of claim 8, wherein the reference voltage is a square wave voltage.

13. The backlight module of claim 12, when the WLED circuit doesn't have the short condition, the voltage of the second terminal has a charging period, wherein the voltage of the second terminal is in a non-charging state when the reference voltage is in a high state and the voltage of the second terminal is in a charging state when the reference voltage is in a low state.

14. The backlight module of claim 8, wherein the detection module generates a disable signal to disable the driver IC when the detection module detects the short condition.

* * * * *